(12) United States Patent
Kao

(10) Patent No.: US 7,852,112 B2
(45) Date of Patent: *Dec. 14, 2010

(54) ON-DIE SYSTEM AND METHOD FOR CONTROLLING TERMINATION IMPEDANCE OF MEMORY DEVICE DATA BUS TERMINALS

(75) Inventor: David Kao, Frisco, TX (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/643,835

(22) Filed: Dec. 21, 2009

(65) Prior Publication Data

US 2010/0097095 A1    Apr. 22, 2010

Related U.S. Application Data

(63) Continuation of application No. 11/804,176, filed on May 16, 2007, now Pat. No. 7,646,213.

(51) Int. Cl.
*H03K 19/003* (2006.01)
(52) U.S. Cl. .................................. 326/30; 327/108
(58) Field of Classification Search .................... 326/30
See application file for complete search history.

(56) References Cited

U.S. PATENT DOCUMENTS

| | | | | |
|---|---|---|---|---|
| 6,307,791 B1 | 10/2001 | Otsuka et al. | ......... | 365/189.05 |
| 6,509,778 B2 | 1/2003 | Braceras et al. | ............. | 327/308 |
| 6,556,052 B2 | 4/2003 | Garrett et al. | ............... | 327/108 |
| 6,674,302 B2 | 1/2004 | Yen | .............................. | 326/30 |
| 6,768,393 B2 | 7/2004 | Song | ........................ | 333/22 R |
| 6,967,500 B1 | 11/2005 | Lin et al. | ....................... | 326/30 |
| 7,148,721 B2 * | 12/2006 | Park | ............................. | 326/30 |
| 7,323,900 B2 | 1/2008 | Kim | ............................ | 326/30 |
| 2006/0226868 A1 | 10/2006 | Lee et al. | ...................... | 326/30 |

OTHER PUBLICATIONS

"*On Die Termination*"; DDR II topic; pp. 1 and 2 date-Aug. 18, 2005.

* cited by examiner

*Primary Examiner*—Rexford N Barnie
*Assistant Examiner*—Crystal L Hammond
(74) *Attorney, Agent, or Firm*—Dorsey & Whitney LLP

(57) ABSTRACT

A system for controlling the termination impedance of memory device data bus terminals is fabricated on the same die as the memory device. The system includes a termination resistor connected to each data bus terminal, which is connected in parallel with several transistors that are selectively turned on to adjust the termination impedance. The transistors are controlled by a circuit that determines the resistance of the termination resistor and turns on the correct number of transistor to properly set the termination impedance. In one example, the resistance of the termination resistor is determined by directly measuring a resistor of the same type as the termination resistor. In another example, the resistance of the termination resistor is determined indirectly by measuring parameters that affect the resistance of the termination resistor. In either case, the system can maintain the termination impedance of the data bus terminals constant despite changes in the termination resistor.

19 Claims, 8 Drawing Sheets

ON-DIE SYSTEM AND METHOD FOR CONTROLLING TERMINATION IMPEDANCE OF MEMORY DEVICE DATA BUS TERMINALS

CROSS-REFERENCE TO RELATED APPLICATION

This application is a continuation of U.S. patent application Ser. No. 11/804,176 filed May 16, 2007, U.S. Pat. No. 7,646,213. This application is incorporated by reference herein in its entirety and for all purposes.

TECHNICAL FIELD

This invention relates to memory devices, and more specifically, to controllably adjusting the termination impedance of data bus terminals that are used to couple write data to and read data from the memory data.

BACKGROUND OF THE INVENTION

Memory devices are typically assembled into memory modules that are used in a computer system. These memory modules typically include single in-line memory modules (SIMMs) having memory devices on one side of the memory module, and dual in-line memory modules (DIMMs) having memory devices on both sides of the memory module. The memory devices of a memory module are accessed in groups. Each of the groups are commonly referred to as "ranks," with single-sided DIMMs typically having one rank of memory devices and double-sided DIMMs having two ranks of memory devices, one rank on either side of the memory module.

Each of the memory devices of a memory module receives a set of signals, which is generated by a memory controller. These signals include command signals for specifying the type of access of a memory device, such as a read or a write, address signals specifying the location in the memory device being accessed, and write data signals corresponding to data that are to be stored in the memory device. The memory device can also transmits to the memory controller read data signals corresponding to data that have been stored in the memory device.

As the operating speed of memory devices continues to increase, timing margins for the various signals related to memory device operation become more critical, particularly for data signals, which are generally transmitted and received at a higher rate than command and address signals. Subtle variations in signal timing and operating conditions can negatively impact memory device performance. Consequently, it is desirable to improve timing margins without sacrificing performance, where possible.

One factor that can adversely affect timing margins is reflection of signals in conductors through which data signals are coupled. Write data signals and read data signals are typically coupled through a data bus that is coupled to several memory devices. As is well known to one skilled in the art, the conductors of the data bus are transmission lines, which have a characteristic impedance. If the impedance of a memory device data bus terminal is not matched to the characteristic impedance of the data bus conductors, write data signals transmitted to the memory device will be partially reflected from the data bus terminals. Similarly, read data signals transmitted to a memory controller will be partially reflected from the data bus terminals of the memory controller if the impedance of the data bus terminals does not match the characteristic impedance of the data bus conductors. These reflected read and write data signals can remain present on the data bus as subsequent data signals are coupled through the data bus, and they can alter in spurious manner the timing of transitions of these subsequent data signals or the amplitude of these subsequent data signals. The result is a reduction in the timing margins of the memory device.

One approach to improving memory device timing margins is the use of on-die termination ("ODT") circuits for data bus terminals to which data input/output buffers are connected. The ODT circuits provide resistive terminations that are approximately matched to the characteristic impedance of the data bus conductors to reduce reflections and thereby improve timing margins of the memory device.

The ODT circuits used in a conventional memory device are typically disabled when the memory device is not receiving write data, and they are enabled when the memory device is receiving write data. When the ODT circuit is disabled, the impedances of its associated data bus terminals are very high to simulate an "open circuit" condition in which the memory device is not connected to the data bus, under this condition, the data bus terminals do not substantially reflect data signals. A typical ODT circuit 10 is shown in FIG. 1. The ODT circuit 10 includes a series combination of a first termination resistor 12, which is connected to a supply voltage $V_{CC}$, a PMOS switching transistor 14, an NMOS switching transistor 16 and a second termination resistor 18, which is connected to ground. The data bus terminal DQ is connected between the transistors 14, 16. The transistor 14 is selectively turned ON by an active high enable signal En, and the transistor 16 is turned ON by its complement, which is generated by an inverter 20.

In operation, the ODT circuit 10 is disabled by an inactive low En signal to turn OFF the transistors 14, 16. The DQ terminals are thus "tri-stated" at a high impedance. When the transistors 14, 16 are turned ON by the active high En signal, the resistors 12, 18 essentially form a voltage divider to set the impedance and bias voltage of the DQ terminal to predetermined values. The resistance of the resistors 12, 18 are generally equal to each other so that the DQ terminal has an impedance of one-half the resistance of the resistors 12,18, and it is biased to a voltage of one-half the supply voltage $V_{CC}$.

The ODT circuit 10 shown in FIG. 1 can markedly reduce the signal reflections from the DQ terminal. However, its performance in this regard is less than optimum because the resistance of the resistors generally cannot be precisely controlled. As is well-known in the art, the resistors 12, 18 are generally fabricated from a polysilicon material. Presently existing semiconductor fabrication techniques do not allow the resistance of polysilicon resistors to be precisely controlled because of process variations. Even if the resistors 12, 18 could be fabricated with the correct resistances, the resistances would change with time as well as other factors such as temperature changes and supply voltage variations. As a result, the DQ terminals of conventional memory devices using the ODT circuit 10 still cause considerable reflections.

One approach that has been used to deal with the inability to fabricate polysilicon resistors with precisely controlled resistances is an ODT circuit 30 as shown in FIG. 2. The ODT circuit 30 uses many of the same components that are used in the ODT circuit 10 of FIG. 1. Therefore, in the interest of brevity, these components have been provided with the same reference numerals, and an explanation of their characteristics and functions will not be repeated. The ODT circuit 30 differs from the ODT circuit 10 shown in FIG. 1 by connecting a plurality of PMOS transistors 34a,b . . . n in parallel with the first termination resistor 12. Similarly, a plurality of NMOS transistors 36a,b . . . n are connected in parallel with the second termination resistor 18. The transistors 34a,b . . . n and 36a,b . . . n are selectively turned ON by signals from a fuse bank 38.

In operation, the termination resistors 12, 18 are intentionally fabricated with resistances that are higher than target resistances. During wafer test, the impedance at the DQ terminal is measured to determine the resistances of the resistors 12, 18. A conventional programming device (not shown) is then used to program a pattern of fuses or anti-fuses in the fuse bank 38 to provide signals that selectively turn ON the transistors 34a,b . . . n, 36a,b . . . n. Turning ON the transistors 34a,b . . . n, 36a,b . . . n lowers the resistance of the parallel combination of the resistor 12 and the transistors 34a,b . . . n and the resistance of the parallel combination of the resistor 18 and the transistors 36a,b . . . n. The degree to which the resistances are lowered depends on the number of transistors 34a,b . . . n, 36a,b . . . n that are turned ON. The number of transistors 34a,b . . . n, 36a,b . . . n that are turned ON corresponds to the number of fuses or anti-fuses programmed by the programmer. The programmer therefore programs the fuse bank 38 based on the DQ impedance measurement to couple the correct number of transistors 34a,b . . . n, 36a,b . . . n in parallel with the resistors 12, 18, respectively, to provide close to the target DQ impedance.

The ODT circuit 30 shown in FIG. 2 provides a substantial improvement in DQ terminal impedance control over the use of the ODT circuit 10 shown in FIG. 1. However, it still suffers from a number of shortcomings, which cause the DQ terminal to significantly reflect signals applied to the DQ terminal. The primary limitation of the ODT circuit 30 results from changes in the resistances of the resistors 12, 18, as well as changes in the ON impedance of the transistors 34a,b . . . n, 36a,b . . . n over time and as a function of temperature and voltage variations. Therefore, even if the ODT circuit 30 can be precisely programmed with the correct DQ termination impedance during fabrication, the DQ termination impedance may not be correct after a memory device containing the ODT circuit 30 has been placed in operation. It is not possible to reprogram the fuse bank 38 to provide the correct DQ termination impedance because the fuse bank 38 must be programmed before the memory device containing the ODT circuit 30 has been packaged. Furthermore, a considerable time can be required during fabrication to test the resistance of the termination resistors 12, 18 and to then program the fuse bank, which can unduly increase the fabrication costs of memory devices containing the ODT circuit 30.

There is therefore a need for an ODT circuit that does not require expensive and time consuming testing and programming during fabrication, that can be fabricated with the correct DQ termination impedance, and that can adapt to changes in the ODT circuit with time as well as temperature, process and supply voltage variations.

DETAILED DESCRIPTION

Figure 1:
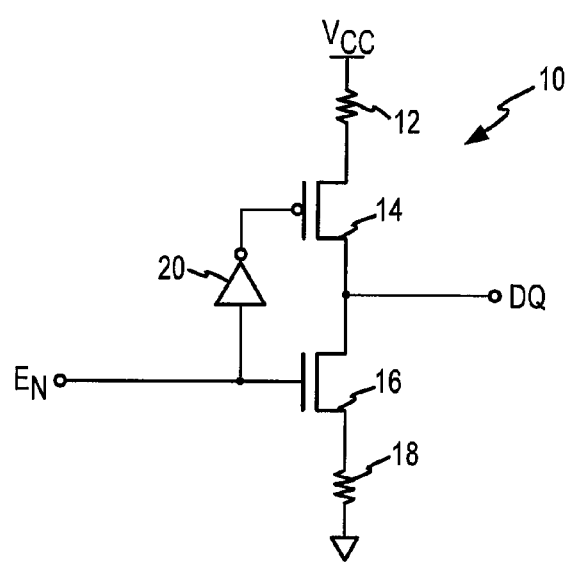
FIG. 1 is a schematic diagram of one example of a conventional ODT circuit that is commonly used in memory devices.
Figure 2:
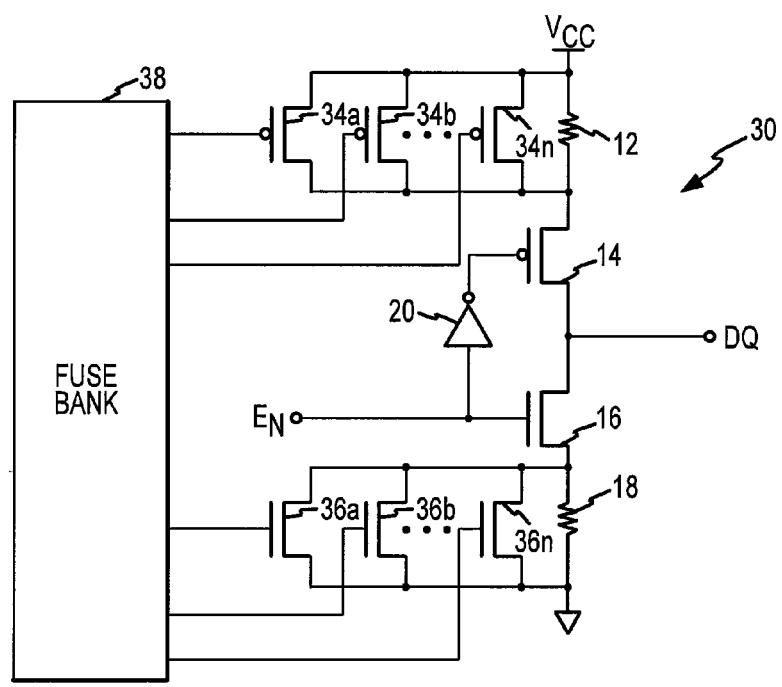
FIG. 2 is a schematic diagram of another example of a conventional ODT circuit that is commonly used in memory devices to address some of the shortfalls of the ODT circuit shown in FIG. 1.
Figure 3:
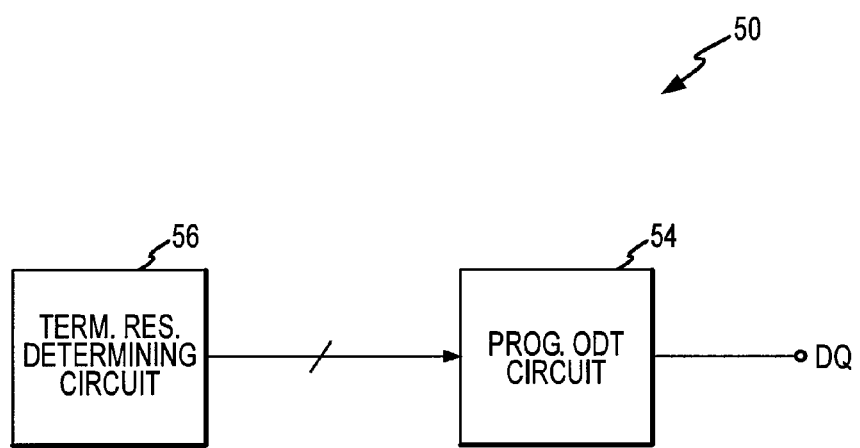
FIG. 3 is a block diagram of an ODT system according to one example of the invention.

An ODT system 50 according to one example of the invention is shown in FIG. 3. The ODT system 50 will generally be fabricated on the same chip as a memory device with which the ODT system 50 is used. The ODT system 50 includes an ODT circuit 54, which may be identical to the ODT circuit 30 shown in FIG. 2 except that the fuse bank 38 is omitted. Instead of programming the ODT circuit 50 with signals from a fuse bank, the ODT circuit 54 is programmed by signals from a termination resistance determining circuit 56. The termination resistance determining circuit 56 determines the termination impedance provided by the termination resistors 12, 18 (FIG. 2) without any of the transistors 34a,b . . . n, 36a,b . . . n turned ON. As explained in greater detail below, the termination resistance determining circuit 56 determines the termination impedance either directly, such as by measuring the resistance of a polysilicon resistor like those used in the ODT circuit 54, or indirectly by measuring various parameters that affect the resistance of the polysilicon resistor like used in the ODT circuit 54. Once the termination resistance determining circuit 56 has determined the resistance of the polysilicon terminal resistors used in the ODT circuit 54, it applies appropriate signals to the ODT circuit 54 to turn ON the correct number of transistors 34a,b . . . n, 36a,b . . . n so that the DQ termination impedance is substantially equal to the target impedance.

Although the ODT system 50 shown in FIG. 3 uses the termination resistance determining circuit 56 to provide signals to a single ODT circuit 54, it can instead provide signals to the single ODT circuits 54 for all or a subset of all of the DQ terminals of the memory device. Also, if the termination impedance of other terminals of the memory device, such as a clock terminal, are to be controlled, the ODT system may be coupled to these terminals as well.

Figure 4:
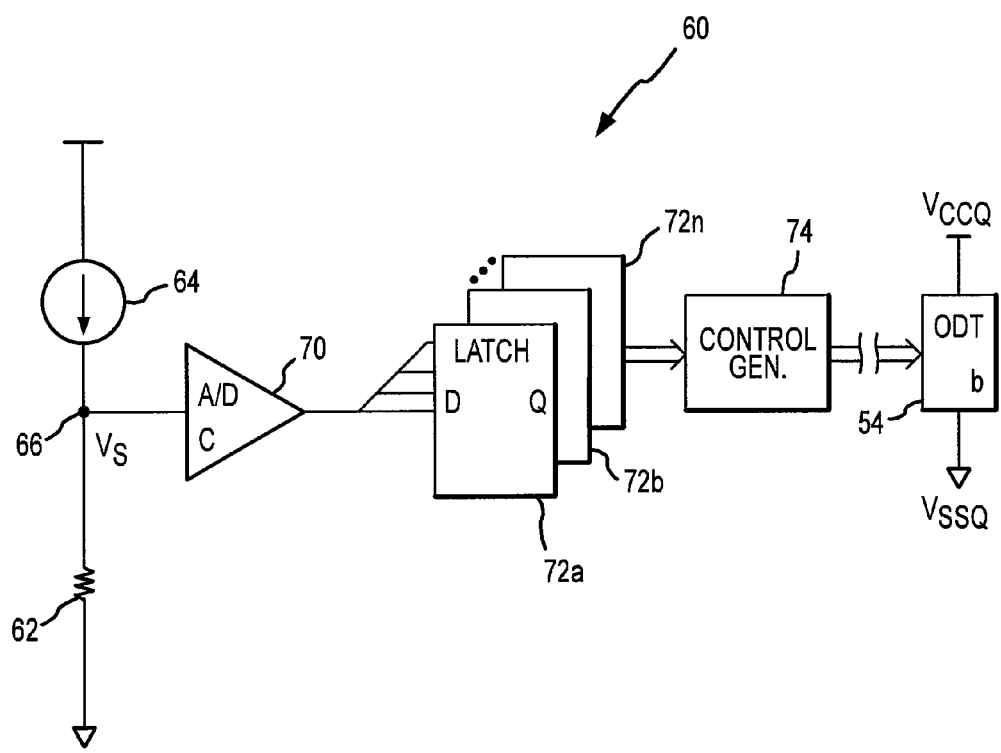
FIG. 4 is a block diagram of an ODT system according to another example of the invention.

An example of an ODT system 60 that directly determines the DQ termination impedance provided by the termination resistors in the ODT circuit 54 is shown in FIG. 4. A termination resistance determining circuit 64 used in the ODT system 60 includes a polysilicon termination resistor 62 that is substantially the same as the polysilicon termination resistors 12, 18 used in the ODT circuit 54. The resistor 62 is connected in series with a current source 64. The voltage $V_S$ at an output node 66 is equal to the product of the current provided by the current source 64 and the resistance of the resistor 62. Therefore, the voltage $V_S$ at an output node 66 is directly proportional to the resistance of the polysilicon resistor 66.

The voltage $V_S$ is applied to an input of an analog-to-digital converter ("A/D/C") 70, which provides a binary value corresponding to the magnitude of the voltage $V_S$. The binary value output from the A/D/C 70 thus provides an indication of the resistance of the polysilicon resistor 62. The number of bits output by the A/D/C 70 will depend upon the desired degree of precision at which the resistance of the resistor 62 is to be determined.

The binary value output from the A/D/C 70 is applied to a set of latches 72a,b . . . n, each of which stores a respective bit of the binary value provided by the A/D/C 70. The binary value stored in the latches 72*a,b . . . n* is applied to a control generator 74, which generates digital activation signals for the transistors 34*a,b . . . c*, 36*a,b . . . c* in the ODT circuit 54. More specifically, the control generator 74 applies digital activation signals to the gates of respective PMOS transistors 14*a,b . . . n* and NMOS transistors 16*a,b . . . n* in the ODT circuit 54 to set the DQ termination impedance to the target value.

The latches 72*a,b . . . n* may be either volatile or non-volatile. If the latches 72*a,b . . . n* are volatile, it is necessary for the ODT system 60 to measure the resistance of the resistor 62 each time power is applied to the ODT system 60. If the latches 72*a,b . . . n* are non-volatile, the same resistance measurement can be continuously used until a new measurement is desired. In some examples of the ODT system 60, a new measurement is made at periodic intervals. In other examples of the ODT system 60, a new measurement is made only when it is manually requested. In still other examples of the ODT system 60, a new measurement is made only when the performance of a memory device containing the ODT system 60 appears to be suffering from excessive signal reflections from the DQ terminals. Other criteria can also be used to determine when a new measurement should be made.

Figure 5:
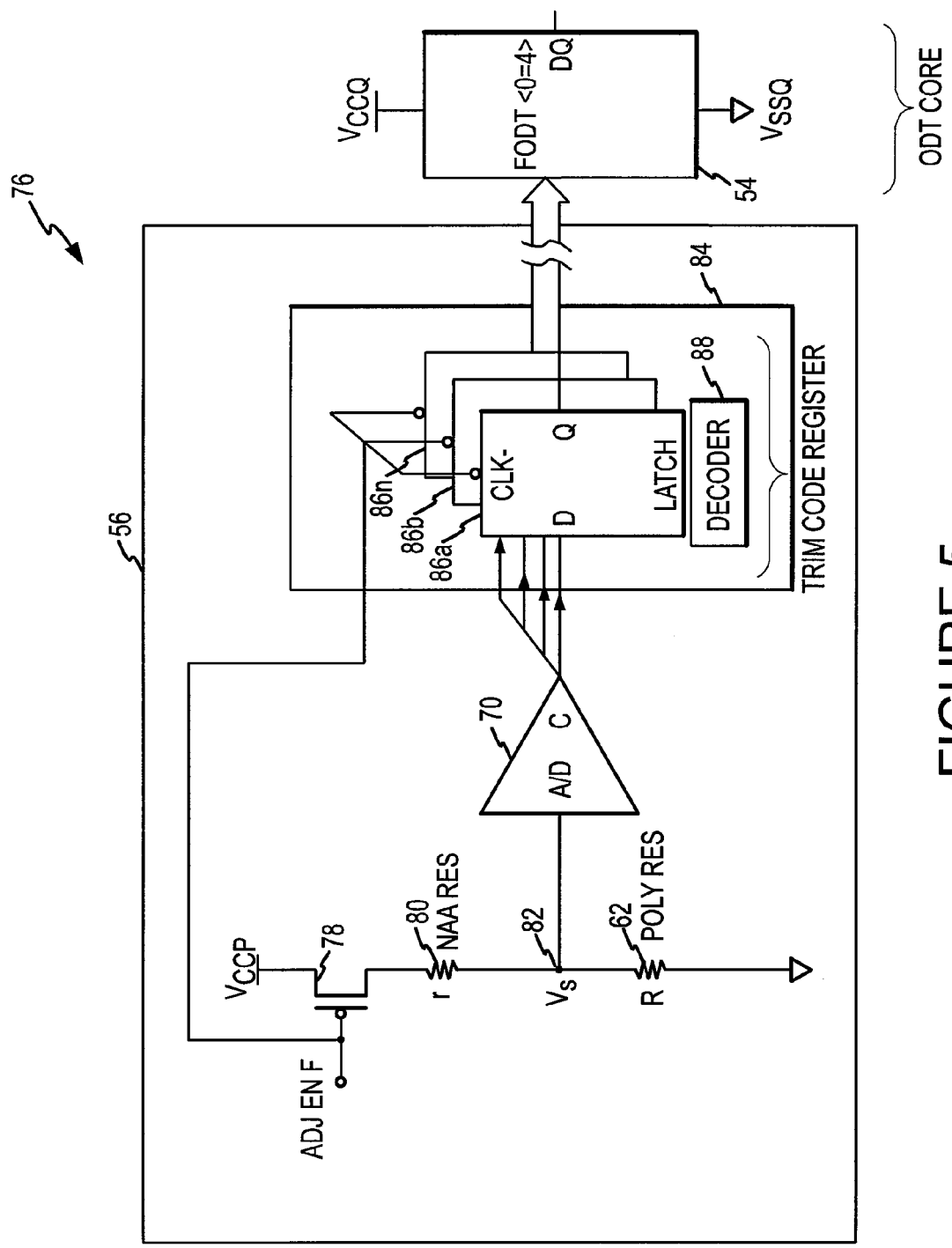
FIG. 5 is a block diagram of an ODT system according to another example of the invention.

A more detailed example of an ODT system 76 that directly determines the DQ termination impedance provided by the termination resistors in the ODT circuit 54 is shown in FIG. 5. The ODT system 76 uses many of the same components that are used in the ODT system 60 of FIG. 4. Therefore, in the interest of brevity and clarity, these common components will be provided with the same reference numerals, and an explanation of their functions will not be repeated. Instead of using a current source 64, termination resistance determining circuit 56 in the ODT system 76 uses a series combination of a PMOS switching transistor 78 and resistor 80 having a precisely controlled resistance. The transistor 78 is turned ON by an active low ADJ EN F signal. The resistor 80 may be a conventional resistor known as an "Naa" resistor, which is essentially a long path of $N^+$ doping in a p-substrate. Using Naa resistors for all of the termination resistors in the ODT circuits 54 would eliminate the impedance matching problems discussed above. However, the large amount of surface area that Naa resistors use on a semiconductor die would make the cost of this approach prohibitive. In contrast, the amount of die area consumed by one or a few Naa resistors uses relatively little die area, and thus does not have a significant adverse impact on the cost of a memory device containing the ODT system 76.

When the transistor 78 is turned ON, the resistors 80, 62 form a voltage divider so that the voltage $V_S$ at an output node 82 is given by the formula:

$$V_S = (R_{62}/(R_{62}+R_{80}))*V_{CCP} \quad \text{[Equation 1]}$$

where $R_{62}$ is the resistance of the polysilicon resistor 62, and $R_{80}$ is the resistance of the Naa resistor 80. The voltage $V_S$ thus provides a measurement of the resistance of the polysilicon resistor 62, which substantially matches the resistance of the polysilicon resistors 12, 18 used in the ODT circuit 54. By making the resistance of the Naa resistor 80 substantially larger than the resistance of the polysilicon resistor 62, the resistor 80 essentially acts as a current source, and Equation 1 can be approximated as:

$$V_S = (R_{66}/R_{70})/V_{CCP} \quad \text{[Equation 2]}.$$

Using Equation 2, the magnitude of the voltage $V_S$ is directly proportional to the resistance of the polysilicon resistor 62. As the resistance of the resistors 12, 18 change with time or as a function of temperature or supply voltage variations, the voltage $V_S$ will change accordingly so that the changed value of the resistance can be determined.

The voltage $V_S$ is applied to the analog-to-digital converter ("A/D/C") 70 that was used in the ODT system 60 of FIG. 4. The binary value output from the A/D/C 70 is applied to a trim code register 84, which includes a set of latches 86*a,b . . . n*, each of which stores a respective bit of the binary value. The trim code register 84 may also include a decode circuit 88 for converting the bits of the binary number to digital activation signals for the transistors 34*a,b . . . c*, 36*a,b . . . c* in the ODT circuit 54. Therefore, the latches 86*a,b . . . n* may store either the bits of the binary value from the A/D/C 70 or digital activation signals derived from the binary value.

Regardless of whether the trim code register 84 stores bits of the binary signal from the A/D/C 70, the digital activation signals, or some other intermediate signals, the trim code register 84 applies digital activation signals to the gates of respective PMOS transistors 14*a,b . . . n* and NMOS transistors 16*a,b . . . n* in the ODT circuit 54 to set the DQ termination impedance to the target value. As with the latches 72*a,b . . . n* used in the ODT system 60 of FIG. 4, the latches 86*a,b . . . n* used in the trim code register 84 may be either volatile or non-volatile.

Figure 6:
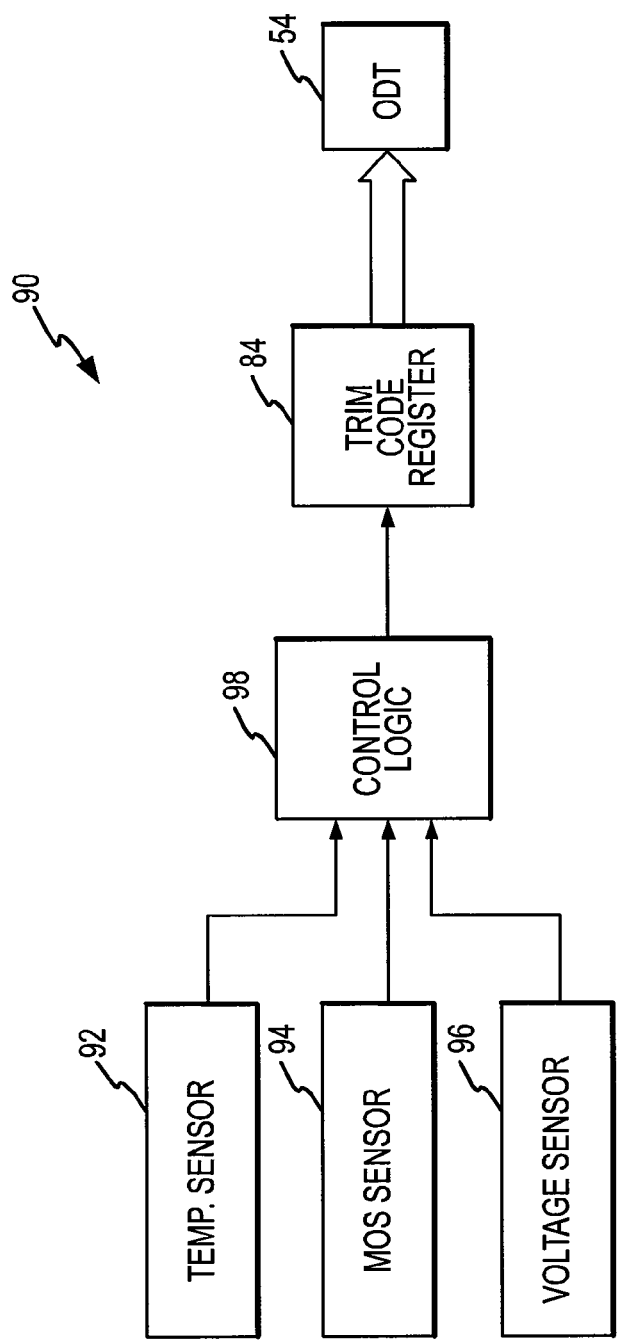
FIG. 6 is a block diagram of an ODT system according to still another example of the invention.

An example of an ODT system 90 that indirectly determines the DQ termination impedance provided by the termination resistors in the ODT circuit 54 is shown in FIG. 6. The ODT system 90 includes a conventional temperature sensor 92, which determines the temperature of a semiconductor die in which the ODT system 90 is fabricated and provides a corresponding output signal. The ODT system 90 also includes an MOS sensor 94, which measures the ON resistance of the ODT enable transistors 14, 16 in the ODT circuit 54 and provides a corresponding output signal. Finally, the ODT system 90 includes a supply voltage sensor 96, which provides an output signal indicative of the magnitude of a supply voltage. As explained above, all of the conditions measured by the sensors 92, 94, 96 are those that affect the resistance of the polysilicon termination resistors 12, 18 used in the ODT circuit 54. Therefore, measuring the value of these conditions allows the resistance of the polysilicon termination resistors 12, 18 to be indirectly determined.

The signals from the sensors 92, 94, 96 are applied to a control logic circuit 98, which generates an output signal indicative of the DQ termination impedance without any of the ODT enable transistors 14, 16 in the ODT circuit 54 turned ON. Basically, the control logic circuit 98 simply implements a known mathematical formula specifying the resistance of a polysilicon termination resistors 12, 18 as a function of temperature and supply voltage, and then adds to that the ON resistance of the ODT enable transistors 14, 16 as determined by the MOS sensor 94.

The control logic circuit 98 outputs a binary value of the DQ termination impedance to the trim code register 84, which operates in essentially the same manner as previously explained with reference to FIG. 5. The trim code register 84 then drives the ODT enable transistors 14, 16 in the ODT circuit 54 in the same manner as also previously explained with reference to FIGS. 4 and 5.

The ODT system according to various examples of the invention, including those previously described, may be used in a variety of electronic devices. For example, the ODT system may be used in a memory devices, such as a synchronous dynamic random access memory ("SDRAM") device 100 shown in FIG. 7. The SDRAM device 100 includes a command decoder 104 that controls the operation of the SDRAM 100 responsive to high-level command signals received on a control bus 106. These high level command signals, which are typically generated by a memory controller (not shown in FIG. 7), are a clock enable signal CKE*, a clock signal CLK, a chip select signal CS*, a write enable signal WE*, a row address strobe signal RAS*, a column address strobe signal CAS*, and a data mask signal DQM, in which the "*" designates the signal as active low. The command decoder 104 generates a sequence of command signals responsive to the high level command signals to carry out the function (e.g., a read or a write) designated by each of the high level command signals. These command signals, and the manner in which they accomplish their respective functions, are conventional. Therefore, in the interest of brevity, a further explanation of these command signals will be omitted.

The command decoder 104 also includes a mode register 108 that can be programmed by a user to control the operating modes and operating features of the SDRAM 100. The mode register 108 is programmed responsive to a load mode ("LDMD") command, which is registered responsive to a predetermined combination of the command signals applied to the command decoder 104 through the control bus 106. One of the operating features that can be programmed into the mode register is the previously described on die termination ("ODT") feature.

The SDRAM 100 includes an address register 112 that receives row addresses and column addresses through an address bus 114. A row address is generally first received by the address register 112 and applied to a row address multiplexer 118. The row address multiplexer 118 couples the row address to a number of components associated with either of two memory banks 120, 122 depending upon the state of a bank address bit forming part of the row address. Associated with each of the memory banks 120, 122 is a respective row address latch 126, which stores the row address, and a row decoder 128, which decodes the row address and applies corresponding row activation signals to one of the arrays 120 or 122. The row address multiplexer 118 also couples row addresses to the row address latches 126 for the purpose of refreshing the memory cells in the arrays 120, 122. The row addresses are generated for refresh purposes by a refresh counter 130, which is controlled by a refresh controller 132.

After the row address has been applied to the address register 112 and stored in one of the row address latches 126, a column address is applied to the address register 112. The address register 112 couples the column address to a column address latch 140. Depending on the operating mode of the SDRAM 100, the column address is either coupled through a burst counter 142 to a column address buffer 144, or to the burst counter 142, which applies a sequence of column addresses to the column address buffer 144 starting at the column address output by the address register 112. In either case, the column address buffer 144 applies a column address to a column decoder 148.

Data to be read from one of the arrays 120, 122 is coupled to column circuitry 150, 152 for one of the arrays 120, 122, respectively. The data is then coupled from the column circuitry 150, 152 through a data output register 156 to data bus terminals 158. Data to be written to one of the arrays 120, 122 are coupled from the data bus terminals 158 to a data input register 160. The write data are coupled from the data input register 160 to the column circuitry 150, 152 where they are transferred to one of the arrays 120, 122, respectively. A mask register 164 selectively alters the flow of data into and out of the column circuitry 150, 152, such as by selectively masking data to be read from the arrays 120, 122.

The SDRAM 100 also includes an ODT system 168 coupled to the data bus terminals 158 for selectively controlling the termination impedance of the data bus terminals 158. The ODT system 168 may be the ODT system 50 shown in FIG. 3, the ODT system 60 shown in FIG. 4, the ODT system 76 shown in FIG. 5, the ODT system 90 shown in FIG. 6, or some other example of an ODT system according to the invention. As explained above, the ODT system 168 precisely controls the termination impedance of the data bus terminals 158 despite changes in the resistance of polysilicon or other termination resistors (not shown) used in an ODT circuit that is part of the ODT system 168. Although the ODT system 168 is shown as a separate component of the SDRAM 100, it will be understood that it may be combined with or incorporated in other components. For example, the ODT system 168 may be incorporated in the data input buffer 160.

Figure 7:
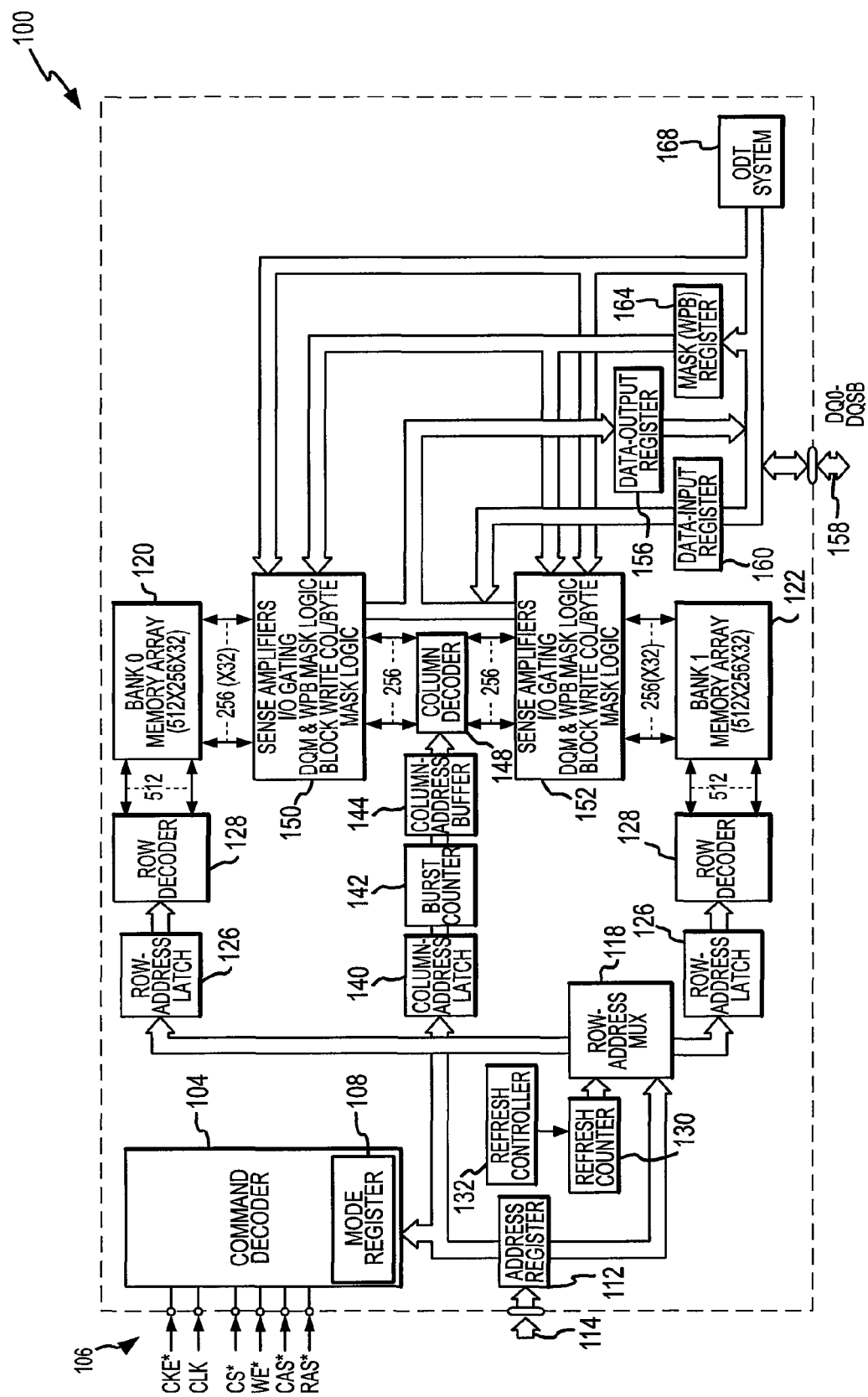
FIG. 7 is a block diagram of a memory system using an ODT system according to one example of the invention.
Figure 8:
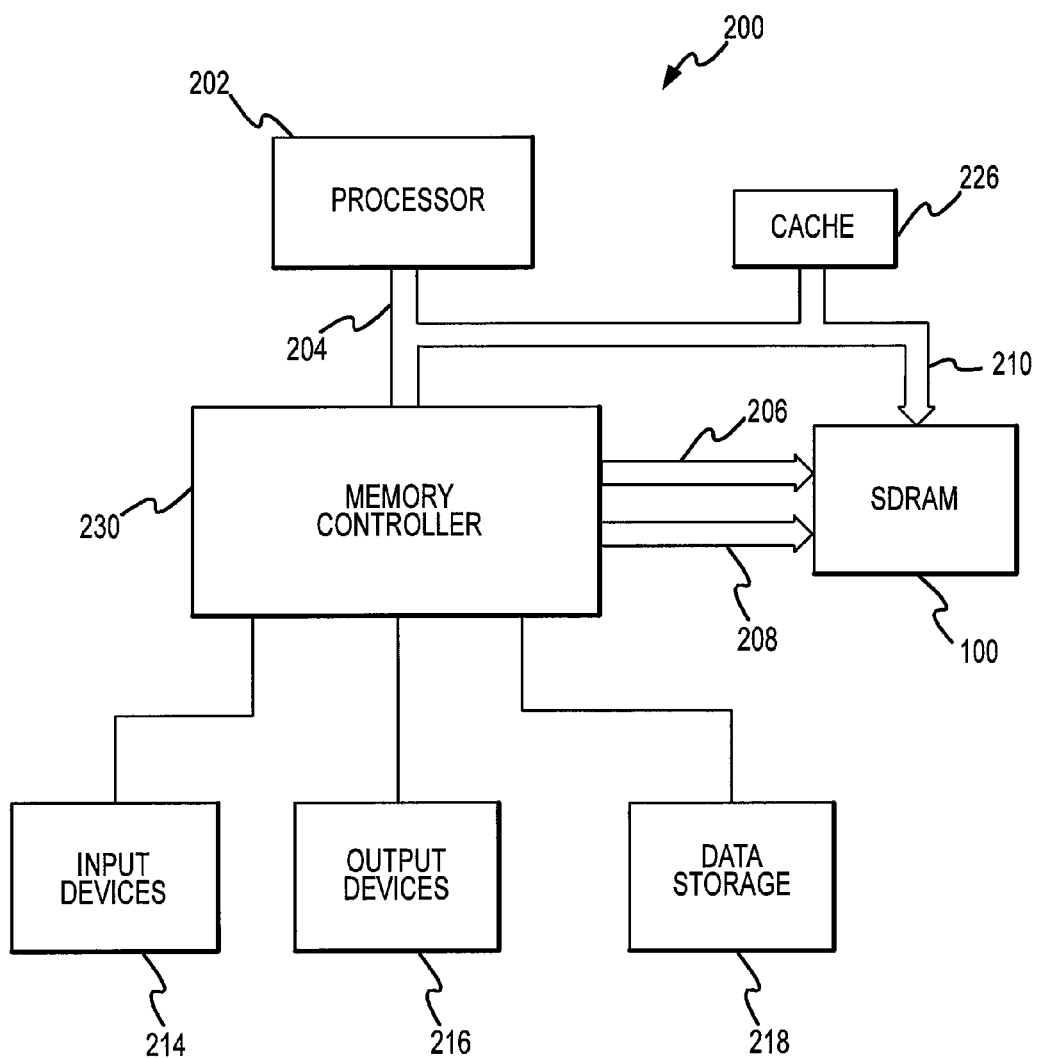
FIG. 8 is a block diagram of a computer system using the memory system of FIG. 7.

The SDRAM 100 shown in FIG. 7 can be used in various electronic systems. For example, it may be used in a processor-based system, such as a computer system 200 shown in FIG. 8. The computer system 200 includes a processor 202 for performing various computing functions, such as executing specific software to perform specific calculations or tasks. The processor 202 includes a processor bus 204 that normally includes an address bus, a control bus, and a data bus. In addition, the computer system 200 includes one or more input devices 214, such as a keyboard or a mouse, coupled to the processor 202 to allow an operator to interface with the computer system 200. Typically, the computer system 200 also includes one or more output devices 216 coupled to the processor 202, such output devices typically being a printer or a video terminal. One or more data storage devices 218 are also typically coupled to the processor 202 to allow the processor 202 to store data in or retrieve data from internal or external storage media (not shown). Examples of typical storage devices 218 include hard and floppy disks, tape cassettes, and compact disk read-only memories (CD-ROMs). The processor 202 is also typically coupled to cache memory 226, which is usually static random access memory ("SRAM"), and to the SDRAM 100 through a memory controller 230. The memory controller 230 normally includes a control bus 236 and an address bus 238 that are coupled to the SDRAM 100. A data bus 240 is coupled from the SDRAM 100 to the processor bus 204 either directly (as shown), through the memory controller 230, or by some other means.

Although the present invention has been described with reference to the disclosed examples, persons skilled in the art will recognize that changes may be made in form and detail without departing from the spirit and scope of the invention. Such modifications are well within the skill of those ordinarily skilled in the art. Accordingly, the invention is not limited except as by the appended claims.

I claim:

1. A termination circuit fabricated on a semiconductor die along with an electronic device having an externally accessible terminal, the termination circuit comprising:

a programmable on-die termination ("ODT") circuit coupled to the externally accessible terminal, the programmable ODT circuit providing the externally accessible terminal with an impedance using the combination of a terminating resistor and a controllable impedance element having an impedance that is controlled by at least one programming signal received by the programmable ODT circuit; and a programming circuit operable to provide the at least one programming signal to the ODT circuit so that the impedance provided by the combination of the terminating resistor and the controllable impedance element is substantially equal to a target impedance, the programming circuit comprising:
- a first resistor having a resistance that varies in a manner that substantially matches the manner in which a resistance of the terminating resistor varies; and
- a measurement circuit for measuring the impedance of the first resistor, the measurement circuit comprising:
  - a second resistor coupled in series with the first resistor between first and second voltages to form a voltage divider having an output node between the first resistor and the second resistor;
  - an analog-to-digital converter having an input coupled to the output node, the analog-to-digital converter generating a binary output signal indicative of a voltage at the output node of the voltage divider; and
  - a register generating a plurality of the programming signals based on the binary output signal.

2. The termination circuit of claim 1 wherein the first resistor has a resistance that varies with a temperature of the first resistor, and wherein the variation of the resistance of the first resistor with the temperature of the first resistor substantially matches the manner in which a resistance of the terminating resistor varies with the temperature of the terminating resistor.

3. The termination circuit of claim 1 wherein the first resistor has a resistance that varies with a processing parameter used to fabricate the first resistor, and wherein the variation of the resistance of the first resistor with a processing parameter used to fabricate the first resistor substantially matches the manner in which a resistance of the terminating resistor varies with a processing parameter used to fabricate the terminating resistor.

4. The termination circuit of claim 1 wherein the first resistor has a resistance that varies with one of the first and second voltages, and wherein the variation of the resistance of the first resistor with one of the first and second voltages substantially matches the manner in which a resistance of the terminating resistor varies with a voltage applied to the terminating resistor.

5. The termination circuit of claim 1 wherein the terminating resistor comprises a polysilicon resistor.

6. The termination circuit of claim 1 wherein the measurement circuit further comprises a switch coupled in series with the first resistor and the second resistor between the first and second voltages for selectively enabling the voltage divider.

7. The termination circuit of claim 1 wherein the first resistor comprises an Naa resistor.

8. The termination circuit of claim 1 wherein the programming circuit comprises:
- a sensor providing an sensor output signal indicative of a condition that causes the resistance of the first resistor to vary in a manner that substantially matches the manner in which a resistance of the terminating resistor varies;
- a control circuit coupled to receive the sensor output signal from the sensor, the control circuit providing an output signal based on the sensor output signal; and
- a register storing a digital signal corresponding to the output signal from the control circuit, the register generating a plurality of the programming signals corresponding to the stored digital signal.

9. The termination circuit of claim 8 wherein the sensor comprises a temperature sensor providing an output signal corresponding to the temperature of a semiconductor die in which the terminating resistor is fabricated.

10. The termination circuit of claim 8 wherein the sensor comprises a voltage sensor providing an output signal corresponding to a voltage applied to a semiconductor die in which the terminating resistor is fabricated.

11. The termination circuit of claim 8 wherein the sensor comprises a processing characteristic sensor providing an output signal corresponding to a processing characteristic of a semiconductor die in which the terminating resistor is fabricated.

12. A method of terminating an externally accessible terminal of an integrated circuit using the combination of a terminating resistor and a controllable impedance element fabricated as part of the integrated circuit, the method comprising:
- determining the approximate impedance of a first resistor fabricated on a semiconductor die of the integrated circuit, the first resistor having an impedance characteristic that varies in substantially the same manner as the manner in which an impedance characteristics of the terminating resistor varies, the approximate impedance of the first resistor being determined by:
  - coupling a second resistor in series with the first resistor between first and second voltages to form a voltage divider having an output node between the first and second resistors;
  - determining the amplitude of the voltage at the output node of the voltage divider; and
  - using the determined amplitude of the voltage to determine the impedance of the first resistor; and
- adjusting the impedance of the controllable impedance element as a function of the determined impedance so that the impedance provided by the combination of the terminating resistor and the controllable impedance element is substantially equal to a target impedance.

13. The method of claim 12, further comprising digitizing the voltage at the output node of the voltage divider before using the determined amplitude of the voltage to determine the impedance of the test resistor.

14. The method of claim 12 wherein the act of determining the approximate impedance of the terminating resistor comprises:
- sensing a condition that affects the impedance of the terminating resistor; and
- using the sensed condition to determine the impedance of the terminating resistor.

15. The method of claim 14 wherein the act of sensing a condition that affects the impedance of the terminating resistor comprises sensing the temperature of a semiconductor die in which the integrated circuit is fabricated.

16. The method of claim 14 wherein the act of sensing a condition that affects the impedance of the terminating resistor comprises sensing the magnitude of a supply voltage applied to the integrated circuit.

17. The method of claim 12 wherein the act of adjusting the impedance of the controllable impedance element comprises:
- sensing a condition that affects the impedance of the terminating resistor; and
- using the sensed condition to adjusting the impedance of the controllable impedance.

18. The method of claim 17 wherein the act of sensing a condition that affects the impedance of the terminating resistor comprises sensing the temperature of a semiconductor die in which the integrated circuit is fabricated.

19. The method of claim 17 wherein the act of sensing a condition that affects the impedance of the terminating resistor comprises sensing the magnitude of a supply voltage applied to the integrated circuit.

* * * * *